US008555224B2

(12) United States Patent
Ishizu et al.

(10) Patent No.: US 8,555,224 B2
(45) Date of Patent: Oct. 8, 2013

(54) CIRCUIT SIMULATION METHOD AND SEMICONDUCTOR INTEGRATED CIRCUIT

(75) Inventors: Tomoyuki Ishizu, Kyoto (JP); Kyouji Yamashita, Toyama (JP); Gaku Suzuki, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/471,061

(22) Filed: May 14, 2012

(65) Prior Publication Data
US 2012/0227016 A1 Sep. 6, 2012

Related U.S. Application Data

(63) Continuation of application No. PCT/JP2011/005932, filed on Oct. 24, 2011.

(30) Foreign Application Priority Data

Dec. 13, 2010 (JP) ................................ 2010-277012

(51) Int. Cl.
*G06F 17/50* (2006.01)
(52) U.S. Cl.
USPC ........................................................ 716/110
(58) Field of Classification Search
USPC .................................. 716/100, 110
See application file for complete search history.

(56) References Cited

U.S. PATENT DOCUMENTS

| 7,792,663 | B2 * | 9/2010 | Ikoma et al. ............... 703/2 |
| 2003/0207576 | A1 * | 11/2003 | Ohtake et al. ............. 438/691 |
| 2007/0113210 | A1 | 5/2007 | Mizuno et al. |
| 2008/0077378 | A1 * | 3/2008 | Ikoma et al. .............. 703/14 |
| 2009/0058456 | A1 * | 3/2009 | Okayasu et al. ............. 324/766 |
| 2012/0227016 | A1 * | 9/2012 | Ishizu et al. ............... 716/52 |
| 2013/0056799 | A1 * | 3/2013 | Ishizu ..................... 257/213 |

FOREIGN PATENT DOCUMENTS

| JP | 2005-294852 | 10/2005 |
| JP | 2008-085030 | 4/2008 |

OTHER PUBLICATIONS

I. Ahsan et al., "RTA-Driven Intra-Die Variations in Stage Delay, and Parametric Sensitivities for 65 nm Technology," 2006 Symposium on VLSI Technology Digest of Technical Papers, pp. 170-171, 2006.
Victor Moroz et al., "Stress-Aware Design Methodology," IEEE Computer Society, 2006, pp. 807-812.
International Search Report issued in International Patent Application No. PCT/JP 2011/005932, issued Oct. 24, 2011.

\* cited by examiner

*Primary Examiner* — Suchin Parihar
(74) *Attorney, Agent, or Firm* — McDermott Will & Emery LLP

(57) ABSTRACT

The present disclosure provides a method of performing circuit simulation of electrical characteristics of a transistor formed on a semiconductor substrate using calculators, each of which includes a memory. A first calculator receives mask layout data and distance-dependent data indicating a distance from the target transistor. Then, a second calculator calculates an area ratio of a layout pattern of a predetermined mask from the received mask layout data, and calculates a parameter α based on the area ratio and the distance-dependent data. Then, the second calculator B calculates a change ΔP in the electrical characteristics of the transistor based on the parameter α. This configuration provides highly accurate circuit simulation of the electrical characteristics of the transistor, which depend on variations in temperature distribution of the semiconductor substrate during heat treatment due to the mask layout pattern around the transistor.

20 Claims, 17 Drawing Sheets

FIG.4

| RECTANGULAR REGION | AREA RATIO | WEIGHTING PARAMETER R | | WEIGHTED AREA RATIO |
|---|---|---|---|---|
| REGION[1] | 0% | a | ↑ HIGH | 0 |
| REGION[2] | 10% | b | | 10 × b |
| REGION[3] | 17% | c | SENSITIVITY | 17 × c |
| REGION[4] | 28% | d | ↓ | 28 × d |
| REGION[5] | 23% | | LOW | 23 × e |
| | | | SUM: | $\alpha$ |

CIRCUIT SIMULATION METHOD AND SEMICONDUCTOR INTEGRATED CIRCUIT

CROSS-REFERENCE TO RELATED APPLICATION

This is a continuation of PCT International Application PCT/JP2011/005932 filed on Oct. 24, 2011, which claims priority to Japanese Patent Application No. 2010-277012 filed on Dec. 13, 2010. The disclosures of these applications including the specifications, the drawings, and the claims are hereby incorporated by reference in their entirety.

BACKGROUND

The present disclosure relates to circuit simulation methods and semiconductor integrated circuits designed by the circuit simulation methods, and more particularly to highly accurate circuit simulation methods in view of a change in the electrical characteristics of transistors caused by the influence of the layout patterns of metal films and insulating films, which are deposited during manufacturing processes, and semiconductor integrated circuits designed by the methods.

In recent years, a further improvement in simulation accuracy of circuit simulators has been demanded in development in system LSIs etc. As miniaturization in semiconductor processes proceeds, the layout patterns and the layout of circuit elements have largely influenced the performance of semiconductor integrated circuits.

In particular, heat distribution of a wafer substrate varies during heat treatment depending on the area ratios and the forms of metal films and insulating films, which are deposited during a manufacturing process. Accordingly, the threshold voltages of transistors could vary. For example, I. Ahsan et al., RTA-Driven Intra-Die Variations in Stage Delay, and Parametric Sensitivities for 65 nm Technology, Symp. on VLSI Technology, pp. 170-171, 2006 reports that a wafer temperature during heat treatment changes according to, for example, the area ratio of an isolation region around a transistor thereby changing delay in the transistor.

As such, the electrical characteristics of a transistor could largely change depending on mask layout patterns forming a metal film and an insulating film. In particular, numbers of transistors in pairs, which require relatively small characteristic differences, are used in a differential amplifier circuit, a current mirror circuit, etc. Thus, a change in the characteristics caused by the layout pattern could influence the performance, the yields, etc. of the circuit. Therefore, the change in the characteristics caused by the layout pattern needs to be highly accurately estimated at a design stage.

Japanese Patent Publication No. 2008-85030 suggests a highly accurate circuit simulation method. In the method, the form of an active region around a transistor (e.g., the width of an isolation region, the length of an active region adjacent to the transistor with the isolation region interposed therebetween, etc.) is defined as a form parameter of the deformation of the transistor to execute the circuit simulation in view of a change in the deformation according to mechanical stress caused by a layout pattern. A mathematical model including the form parameters representing the electrical characteristics of the transistor is used to carry out the simulation method.

FIG. 17 is a top view of a circuit to be simulated and illustrates a parameter used in a mathematical model representing the electrical characteristics of a transistor in a conventional circuit simulation method.

In the figure, a transistor 25 surrounded by an isolation region is formed on a semiconductor substrate. Adjacent active regions 26 are formed around the transistor 25 with the isolation region interposed therebetween. Mechanical stress is caused in a channel region of the transistor 25 by a difference in the coefficient of thermal expansion between the isolation region and the active regions, thereby changing the electrical characteristics of the transistor.

In the conventional method, in order to consider a change in the characteristics caused by the layout patterns of the adjacent active regions 26, a length 27 between the end of the active region of the transistor 25 and the end of each of the facing active region 26, and a length 28 of the adjacent active region 26 are defined as parameters, and used in an approximation expression representing the electrical characteristics.

The mechanical stress reaches its peak at the boundary between the isolation region and the active region, and the distance between the boundary and the transistor determines the influence of the mechanical stress. Thus, as shown in the conventional method, the length parameters 27 and 28 accurately express a change in the electrical characteristics.

However, the layout pattern of a metal film deposited during the manufacturing process of the transistor, and the layout patterns of the active region and a gate electrode could cause variations in substrate temperature distribution during heat treatment, thereby changing the electrical characteristics such as the threshold voltage of the transistor. In this phenomenon, not only the distance between the layout pattern and the transistor but also the area ratio of the layout pattern influence a change in the electrical characteristics.

As described above, in the conventional method, sufficiently accurate circuit simulation cannot be provided simply by defining and considering only the distance parameters such as the length 27 between the adjacent active region and the transistor, and the length 28 of the adjacent active region. Then, the performance and the yields of the circuit may be deteriorated.

It is an objective of the present disclosure to solve the problems of the conventional method, and to provide a circuit simulation method with a small simulation error, and a semiconductor integrated circuit, which estimates a change in electrical characteristics caused by a layout pattern at the design stage, and reduces deterioration in the performance and the yields of the circuit.

SUMMARY

In order to achieve the objective, a circuit simulation method according to the present disclosure includes calculating a change in electrical characteristics of a transistor caused by variations in temperature distribution of a semiconductor substrate during heat treatment depending on a mask layout patterns of a metal film deposited during the manufacturing process of the transistor, an active region, a gate electrode, etc., around the transistor based on an area ratio of the mask layout pattern around the transistor and distance-dependent data indicating degree of an influence according to a distance from the transistor.

Specifically, a first aspect of the present disclosure provides a method of performing circuit simulation of electrical characteristics of a transistor formed on a semiconductor substrate using at least one calculator including a memory. The method includes: inputting mask layout data and distance-dependent data indicating degree of an influence according to a distance from the transistor using the calculator; calculating an area ratio of a layout pattern of a predetermined mask from the mask layout data using the calculator; calculating a parameter α based on the calculated area ratio and the distance-dependent data using the calculator; and calculating a change in the electrical characteristics of the transistor based on the calculated parameter α using the calculator.

The method of the first aspect may further include performing circuit simulation of the electrical characteristics of the transistor using the calculator in view of the change in the electrical characteristics of the transistor, which has been calculated in the calculating the change in the electrical characteristics.

In the method of the first aspect, in the calculating the area ratio, a mask layout pattern of a metal film deposited when the transistor is formed may be extracted as the layout pattern of the predetermined mask, and an area ratio of the extracted mask layout pattern of the metal film may be calculated. In the calculating the parameter, the parameter α may be calculated based on the area ratio of the extracted mask layout pattern of the metal film and distance-dependent data corresponding to the mask layout pattern of the metal film.

In this case, the mask layout pattern of the metal film is a mask layout pattern of a TiN film.

In the method of the first aspect, in the calculating the area ratio, a mask layout pattern of an active region may be extracted as the layout pattern of the predetermined mask, and an area ratio of the extracted mask layout pattern of the active region may be calculated. In the calculating the parameter, the parameter α may be calculated based on the area ratio of the extracted mask layout pattern of the active region and distance-dependent data corresponding to the mask layout pattern of the active region.

In the method of the first aspect, in the calculating the area ratio, a mask layout pattern of a gate electrode may be extracted as the layout pattern of the predetermined mask, and an area ratio of the extracted mask layout pattern of the gate electrode may be calculated. In the calculating the parameter, the parameter α may be calculated based on the area ratio of the extracted mask layout pattern of the gate electrode and distance-dependent data corresponding to the mask layout pattern of the gate electrode.

A second aspect of the present disclosure provides a method of performing circuit simulation of electrical characteristics of a transistor formed on a semiconductor substrate using at least one calculator including a memory. The method includes: inputting mask layout data and distance-dependent data indicating degree of an influence according to a distance from the transistor using the calculator; calculating an area ratio of a layout pattern of a predetermined mask from the mask layout data using the calculator; calculating a parameter α based on the calculated area ratio and the distance-dependent data using the calculator; and performing circuit simulation of the electrical characteristics of the transistor based on the calculated parameter α using the calculator.

In the methods of the first and second aspects, in the calculating the area ratio, the area ratio of the layout pattern of the predetermined mask may be calculated in each of regions of a predetermined area.

In this case, in the calculating the parameter, the area ratio of each of the regions, which has been calculated in the calculating the area ratio, may be multiplied by distance-dependent data corresponding to a distance between the transistor and the region on a region-by-region basis, and the parameter α may be obtained by summing multiplication results of the regions.

The methods of the first and second aspects further include inputting positional information of the transistor using the calculator. In the calculating the area ratio, the area ratio of the layout pattern of the predetermined mask is calculated within a predetermined distance from the transistor.

In this case, the predetermined distance may be determined based on a maximum range in which the predetermined mask layout pattern influences the transistor, and may be about ten or more times as long as a distance between the transistor and a mask layout pattern located at a minimum distance in a manufacturing process.

In the methods of the first and second aspects, the electrical characteristics of the transistor may be a current flowing to the transistor or a threshold voltage of the transistor.

In the methods of the first and second aspects, the at least one calculator may include multiple ones of calculators. The calculators may execute different simulating steps.

The present disclosure provides a semiconductor integrated circuit designed by the methods of the first and second aspects.

As such, in the circuit simulation method of the present disclosure, the parameter α is calculated by weighting the area ratio data of the predetermined mask layout pattern around the predetermined transistor based on the distance-dependent data. Then, the change in the electrical characteristics of the transistor is calculated based on the parameter α and is taken into consideration in the circuit simulation, thereby reflecting the electrical characteristic change corresponding to the predetermined mask layout pattern around the predetermined transistor. This enables highly accurate simulation at the circuit level.

As described above, the circuit simulation method of the present disclosure provides circuit simulation in view of the influence of the mask layout patterns of a metal film, an active region, and a gate electrode, which are located around the transistor, and improves the simulation accuracy.

BRIEF DESCRIPTION OF THE DRAWINGS

FIG. 4 illustrates a specific example of the calculation of the parameter α.

DETAILED DESCRIPTION

First Embodiment

Figure 1:
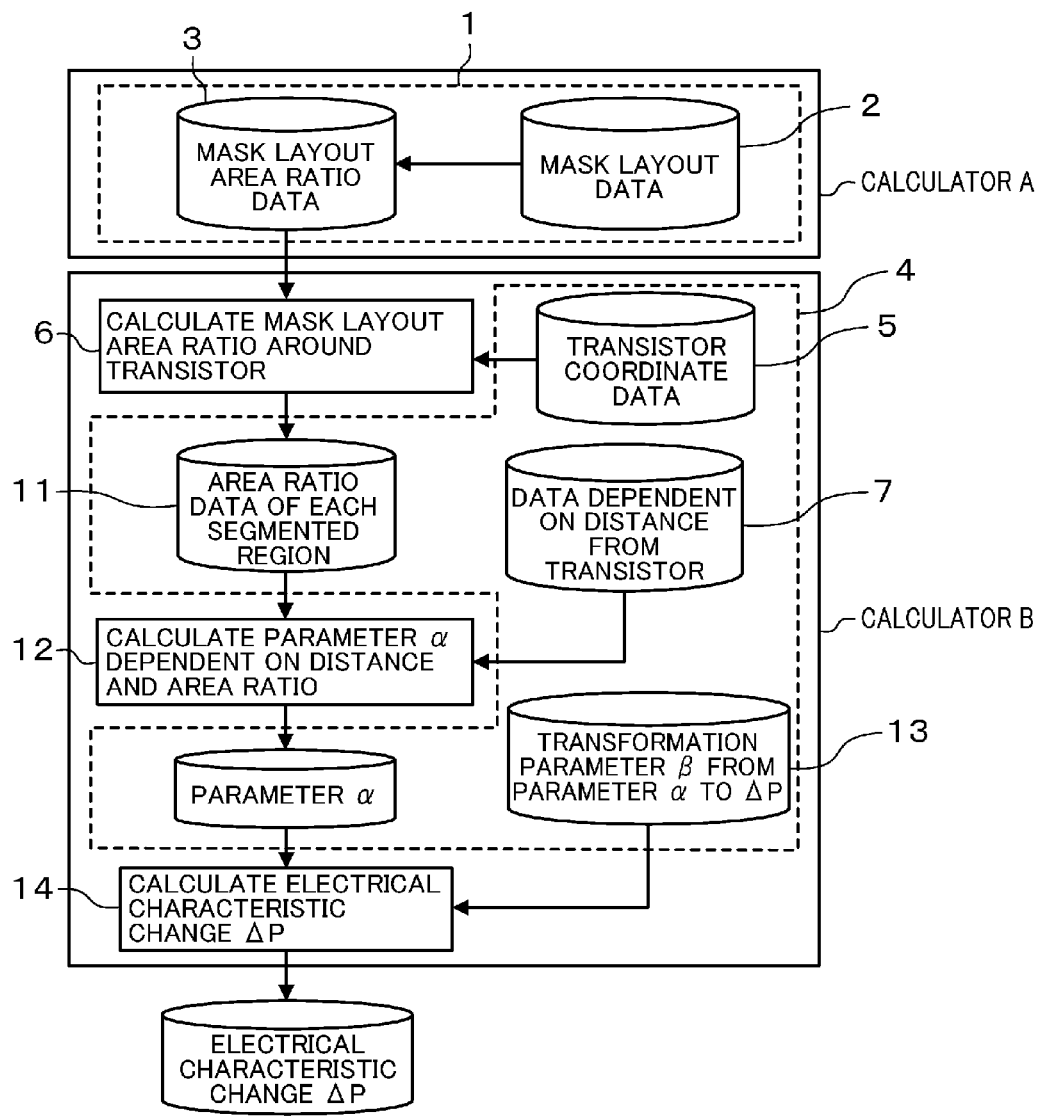
FIG. 1 is a flow chart illustrating a circuit simulation method according to a first embodiment of the present disclosure.

A circuit simulation method according to a first embodiment of the present disclosure will be described hereinafter with reference to the drawings. In the method of this embodiment, a change in the electrical characteristics of a transistor caused by the influence of a pattern of mask layout is taken into consideration in circuit designing. FIG. 1 illustrates the method.

Figure 2:
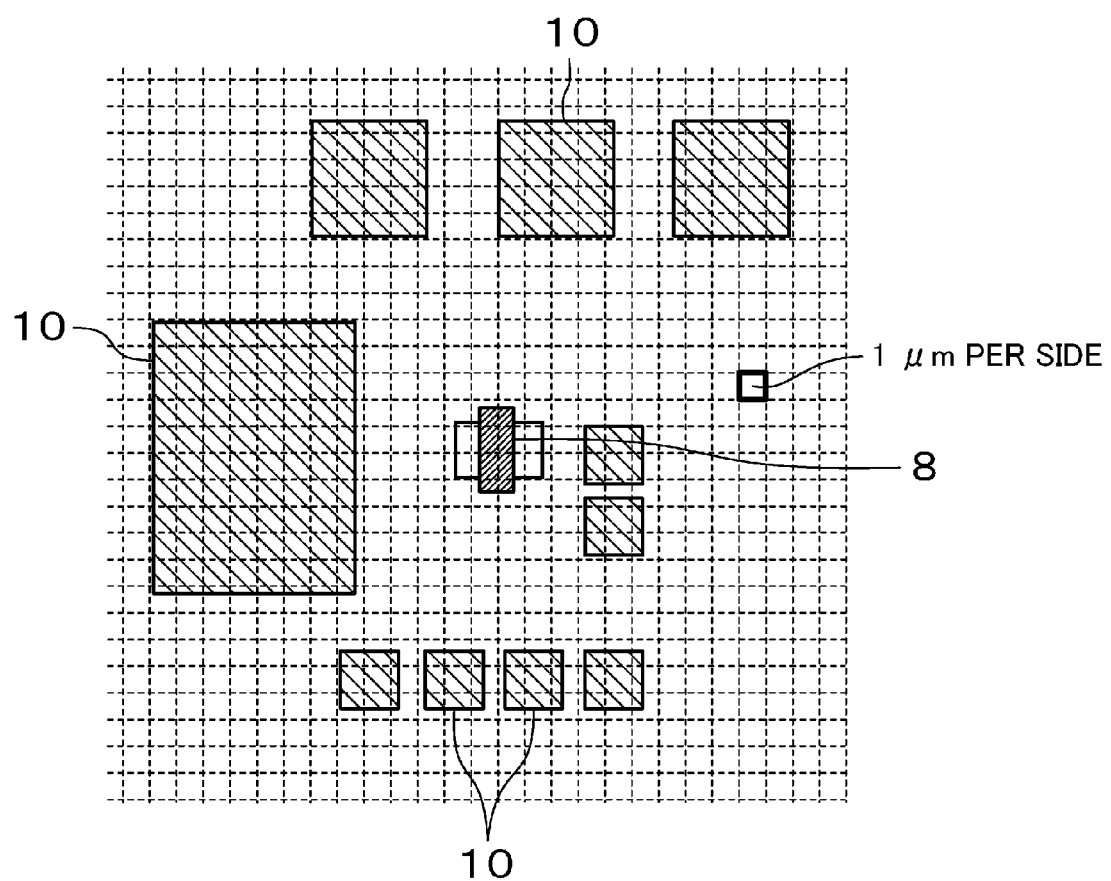
FIG. 2 illustrates segmentation of mask layout data of a circuit to be simulated into rectangular regions.

In the figure, the circuit simulation method according to this embodiment is performed using a calculator A and a memory 1. First, as shown in FIG. 2, the calculator A receives mask layout data 2 indicating design information of a circuit to be simulated (inputting). The mask layout data 2 is segmented into rectangular regions of 1 μm per side, and mask layout area ratio data 3 indicating the area ratio of target mask layout 10, which is calculated in each of the rectangular regions, is stored in the memory 1.

In this embodiment, the target mask layout is a mask layout used when forming patterns of a metal film and an insulating film, which are deposited during a manufacturing process. For example, in a metal gate, the target mask layout is a mask layout pattern for forming a metal film used as a hard mask to control the threshold voltages of transistors in each device. Alternatively, the target mask layout may be a mask pattern for forming an active region of a transistor, or a mask layout pattern for forming a gate electrode of a transistor.

The mask layout area ratio data 3 includes coordinate information of the rectangular regions and area ratio information of the rectangular regions at their coordinates. The area ratio is preferably extracted in each of the rectangular regions as small as at least 10 μm or less per side.

The circuit simulation method according to this embodiment is further performed using a calculator B and a memory 4. The calculator B inputs the mask layout area ratio data 3, and transistor coordinate data (positional information) 5 indicating the position of a target transistor to the memory 4 (inputting positional information). Then, the calculator B executes area ratio calculation 6 for calculating the mask layout area ratio around the target transistor, and stores the area ratio data 11 obtained by the calculation in the memory 4.

The calculator B also receives distance-dependent data 7 indicating degree of an influence according to the distance from the target transistor (inputting). Then, the calculator B executes parameter calculation 12 of calculating a parameter α dependent on the distance and the area ratio of the mask layout around the target transistor based on the calculated area ratio data 11 and the distance-dependent data 7.

Figure 3:
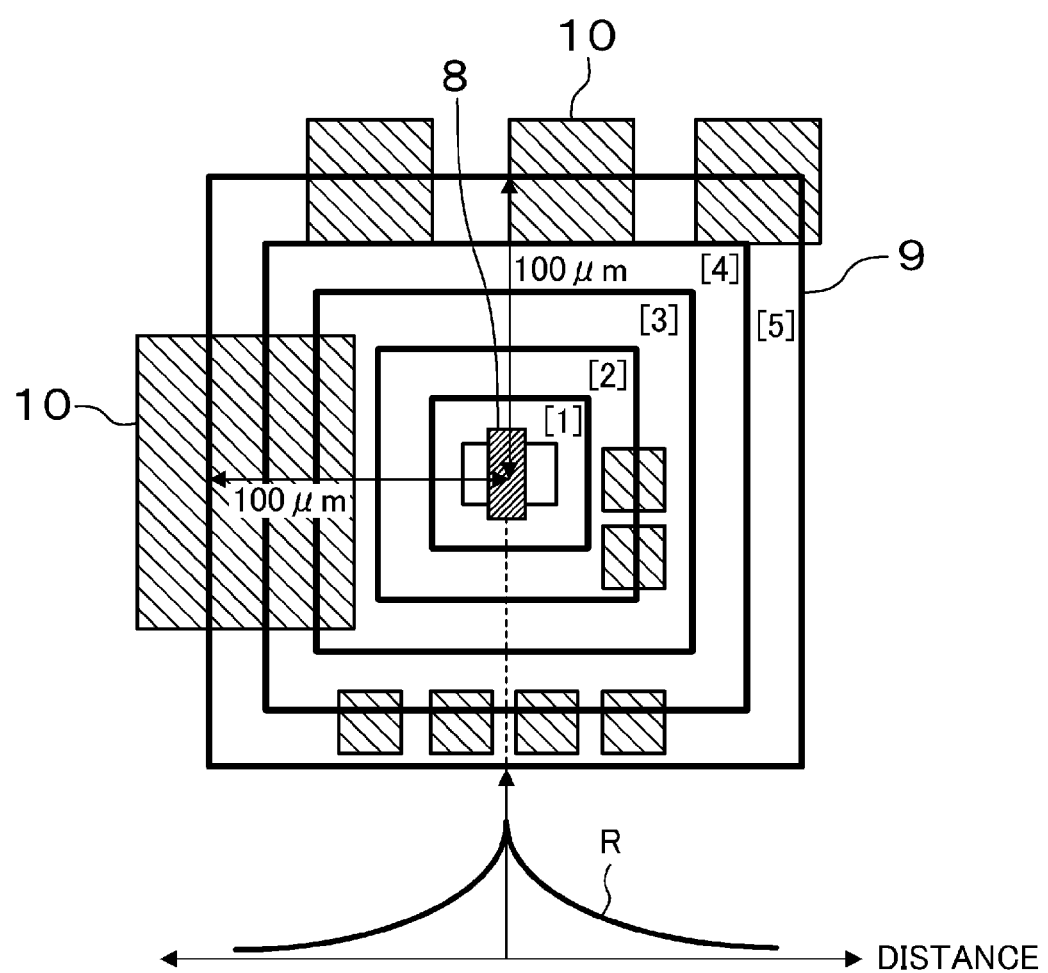
FIG. 3 illustrates calculation of parameter α in the circuit simulation method.

The area ratio calculation 6 and the parameter calculation 12 will be described in detail. First, the area ratio calculation 6 will be described. As shown in FIG. 3, in the area ratio calculation 6, the area ratio information of the target mask layout 10 within a predetermined distance from the layout position of a target transistor 8, for example, in a rectangular region 9 within about 100 μm around the target transistor 8, is extracted based on the mask layout area ratio data 3, which has been calculated by the calculator A, and the transistor coordinate data 5. While the range of the rectangular region 9 is within about 100 μm, a most preferable range of the predetermined distance is determined based on a maximum range in which the target mask layout 10 influences the target transistor, and is about ten or more times as long as a distance between the target transistor 8 and a mask layout pattern located at a minimum distance under predetermined design constrains in a manufacturing process. This is because, the influence of the target mask layout 10 on the target transistor extends to a distance which is about ten times as long as the minimum distance.

As shown in FIG. 3, the rectangular region 9 within about 100 μm is segmented into regions around the target transistor 8 so that the distances from the target transistor 8 are equal. Then, a mask layout area ratio 11 of each of the segmented regions is extracted. The rectangular region 9 is segmented into at least two regions, and the number of the segmented regions is preferably large. As a specific example, as shown in FIG. 3, the rectangular region 9 is segmented into, for example, five regions. The five segmented regions are defined as segmented regions [1]-[5] in order of increasing distance from the target transistor 8, and the area ratio of the layout masks 10 is calculated in each of the segmented regions [1]-[5].

Then, the detail of the parameter calculation 12 will be described. In the parameter calculation 12, the mask layout area ratio 11 of each of the segmented regions [1]-[5] is weighted based on the distance from the target transistor 8, and the distance-dependent data 7 according to the distance from the target transistor 8. The distance-dependent data 7 is data represented by the function of the degree of the change in the electrical characteristics caused by the target mask layout 10. The weighting based on the distance-dependent data 7 is set so that the closer the region is to the target transistor 8, the greater the influence is. The sum of the weighted mask layout area ratios 11 of the segmented regions is defined as a parameter α. The parameter α is calculated for each target transistor and stored in the memory 4. A specific example of the calculation of the parameter α will be described below.

First, the function of the distance-dependent data 7 according to the distance from the target transistor is expressed by the following equation (1).

$$R = \frac{X}{L_{Tr}^{Y}} + Z \quad (1)$$

R is a parameter indicating weighting. $L_{Tr}$ is a distance from the target transistor. X, Y, and Z are fitting coefficients.

The weighting parameter R of each of the segmented regions [1]-[5] is calculated, which is obtained from the equation (1) according to the distance between the target transistor 8 and the segmented region. As exemplified in FIG. 4, the weighting parameters R are calculated as "a" in the region [1], "b" in the region [2], "c" in the region [3], "d" in the region [4], and "e" in the region [5]. The calculated weighting parameters R have the following relationship. The value "a" of the region [1], which is located at the shortest distance from the target transistor 8, has the greatest value (the highest sensitivity), and the value "e" of the region [5], which is located at the longest distance from the target transistor 8, has the smallest value (the lowest sensitivity) (i.e., a>b>c>d>e). The area ratio of the layout masks 10 calculated in each of the regions [1]-[5] (in the figure, 0% in the region [1], 10% in the region [2], 17% in the region [3], 28% in the region [4], and 23% in the region [5]) is multiplied by the corresponding weighting parameter R to calculate the weighted area ratio of each of the regions [1]-[5] (specifically, 0 in the region [1], 10×b in the region [2], 17×c in the region [3], 28×d in the region [4], and 23×e in the region [5]). Then, the weighted area ratios of the regions [1]-[5] are summed to obtain the parameter α.

The example mask layout around the target transistor 8 shown in FIG. 3 is simply the mask layout 10. The types of the layout mask are, as described above, the layout masks of an active region, a gate electrode, and a metal film. The mechanisms of influencing the characteristics of the target transistor 8 differ depending on the types of the layout masks, and thus, the distance-dependency of the degree of the influence of the characteristic change according to the distance from the target transistor 8 is also different. Therefore, the parameter α is calculated in each of the layout masks of the active region, the gate electrode, and the metal film.

Figure 5:
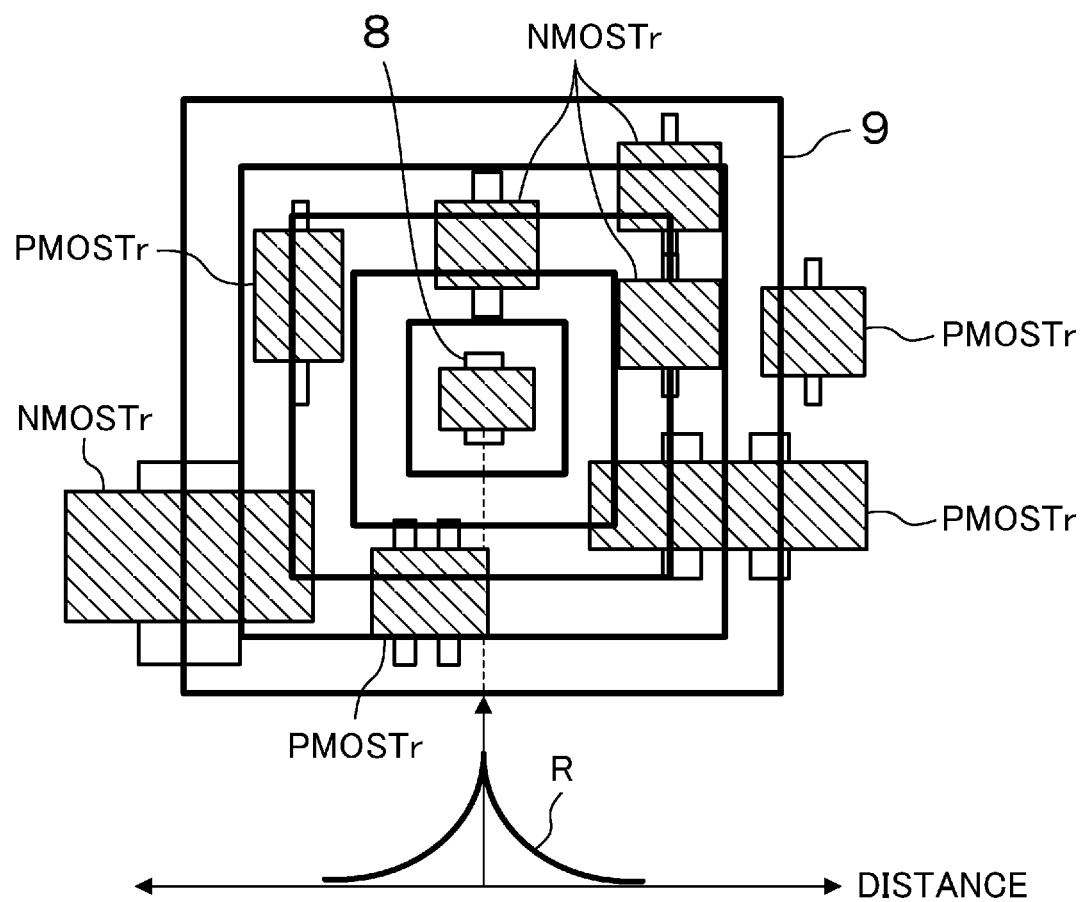
FIG. 5 is a view corresponding to FIG. 3 where a layout mask is an active region.
Figure 6:
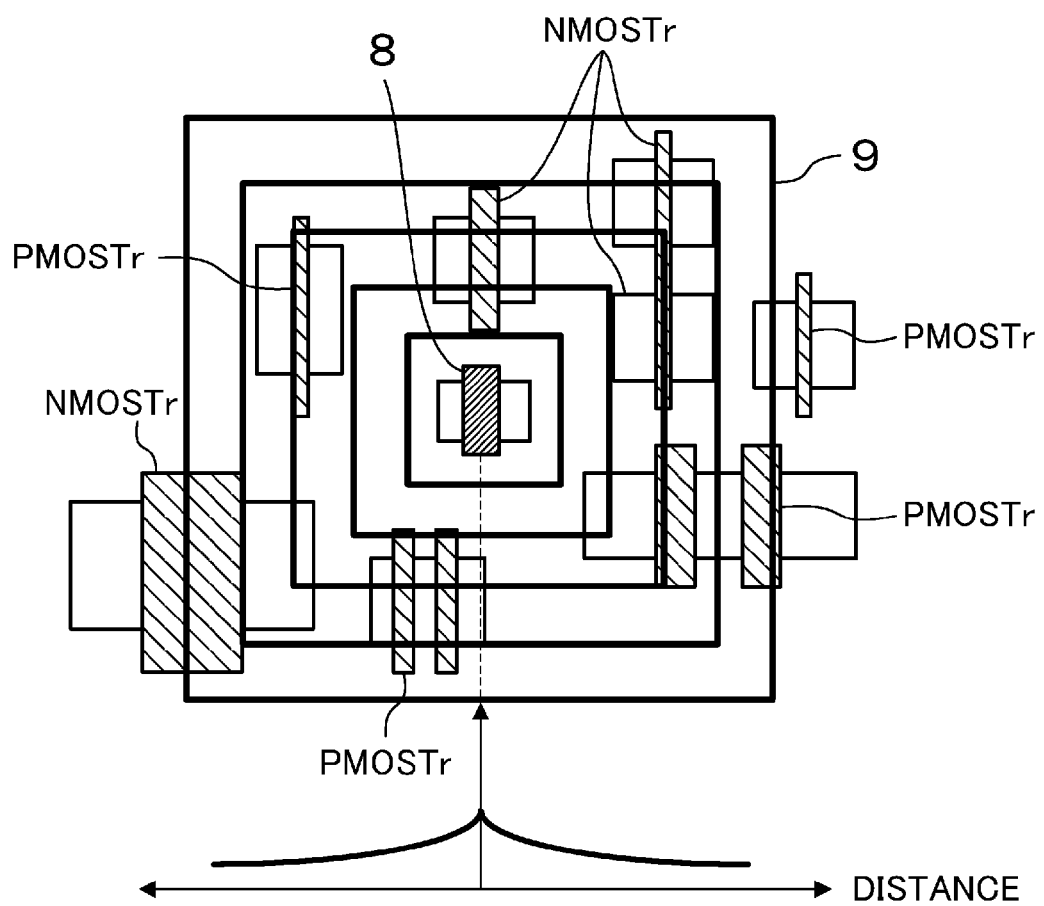
FIG. 6 is a view corresponding to FIG. 3 where the layout mask is a gate electrode.
Figure 7:
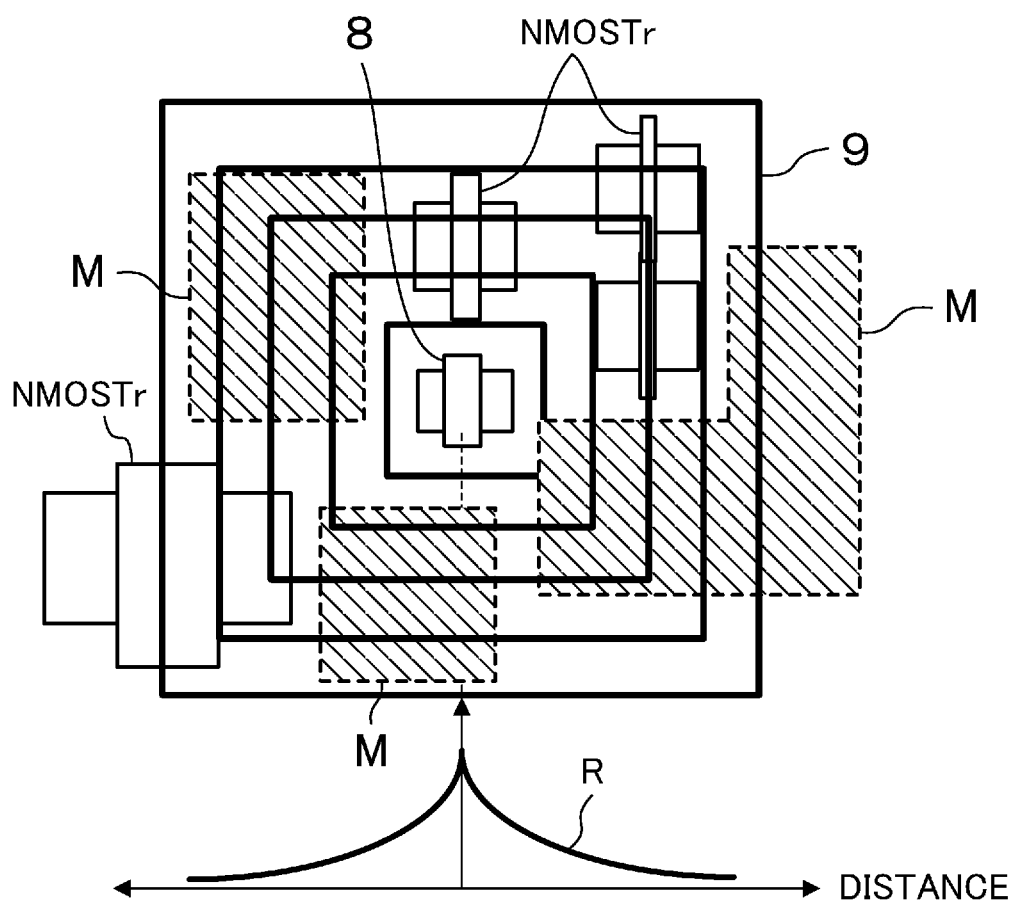
FIG. 7 is a view corresponding to FIG. 3 where the layout mask is a metal film.

FIGS. 5, 6, and 7 illustrate calculation of the parameter α in layout masks of active regions, gate electrodes, and metal films, respectively.

FIG. 5 illustrates a layout example where the target layout masks 10 are the layout masks of active regions of the transistor, and correspond to the hatched regions. The area ratio of the active regions in each of the five segmented regions is calculated, and weighted as described above, based on the distance-dependent data 7 corresponding to the layout masks of the active regions. The parameter α is then obtained.

FIG. 6 illustrates a layout example where the target layout masks 10 are the layout masks of gate electrodes, and correspond to the hatched regions. Similar to the layout masks of the active regions, the area ratio of the layout masks of the gate electrodes in each of the five segmented regions is calculated, and weighted as described above, based on the distance-dependent data 7 corresponding to the layout masks of the gate electrodes. The parameter α is then obtained.

FIG. 7 illustrates a layout example where the target layout masks 10 are the layout masks of metal films, and correspond to the hatched regions. The metal films are, for example, TiN films deposited when used as hard masks to control the threshold voltages of transistors in each device in formation of metal gate electrodes. In the example shown in FIG. 7, mask layout patterns M of the metal films are covered only by PMOS transistor regions to control the work functions of the gate electrodes in NMOS transistors and PMOS transistors, separately. Similar to the layout masks of the active regions and the gate electrodes, the area ratio of the metal films in each of the five segmented regions is calculated, and weighted as described above, based on the distance-dependent data 7 corresponding to the layout masks of the metal films. The parameter α is then obtained.

Next, in FIG. 1, the calculator B executes characteristic change calculation 14 for calculating an electrical characteristic change ΔP of the target transistor 8 caused by the influence of a mask layout pattern based on the calculated parameter α, and the transformation parameter β (13) used when calculating the electrical characteristic change ΔP from the parameter α. The electrical characteristic change ΔP is obtained by the following equation (2).

$$\Delta P = \text{Parameter } \alpha \times \text{Transformation Parameter } \beta \quad (2)$$

The transformation parameter β is included in the transformation parameter 13 for transforming the parameter α to the electrical characteristic change ΔP. The transformation parameter β is empirically obtained from measurement results of known evaluation patterns, etc. The electrical parameter of the target transistor 8, which is calculated as the electrical characteristic change ΔP, includes the transistor current, the threshold voltage, etc.

By calculating the electrical characteristic change ΔP, the electrical characteristics corresponding to the pattern of the desired mask layout 10 can be figured out at a design stage. Note that the electrical characteristic change ΔP is reflected in the circuit simulation, thereby providing highly accurate circuit designing. For example, in a BSIM4, which is a representative MOSFET model, a change in the threshold voltage can be reflected in circuit simulation using the parameter delvto.

Figure 8:
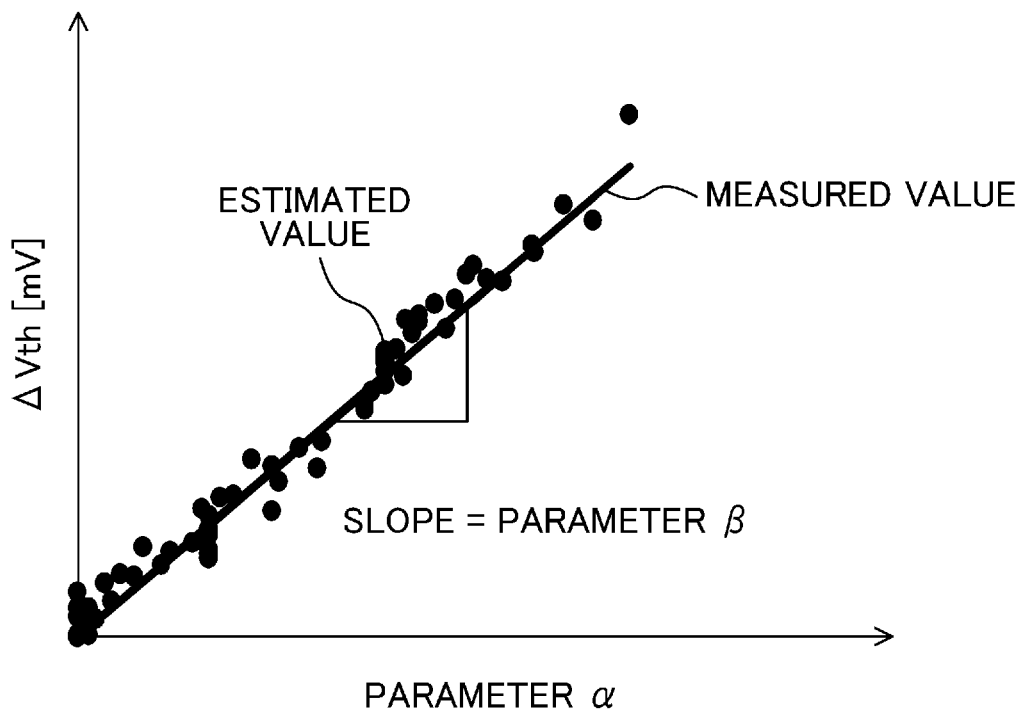
FIG. 8 illustrates comparison between measurement results of a change in the threshold voltage of a transistor caused by a mask layout pattern forming the metal film, and the result of performing the circuit simulation method according to the first embodiment.

FIG. 8 illustrates results of changes in the threshold voltage of a transistor, in which a metal film is used as a hard mask at annealing in formation of a metal gate, due to the mask layout pattern for forming the metal film. The results are obtained by a plurality of transistors having various mask layout patterns around them. The dots represent the measurement results, and the line represents an estimated value of a change ΔVth in the threshold voltage obtained by the circuit simulation method according to the first embodiment of the present disclosure.

The horizontal axis of the figure represents the parameter α dependent on the area ratio of the mask layout around each of the target transistors, and the distance from the transistor. The vertical axis represents the change ΔVth in the transistor threshold voltage. All the transistors to be evaluated are formed in the same size and layout, and influences of the target mask layouts are excluded. Note that the transformation parameter β is a slope of the relationship between the parameter α and the changes ΔVth in the threshold voltage of the transistor.

From the results shown in FIG. 8, the estimated value of the change in the threshold according to the first embodiment of the present disclosure closely coincides with the measurement results. The estimation of the change in the threshold voltage is considered at the design stage, thereby achieving highly accurate circuit designing. As a result, a semiconductor integrated circuit with mitigated reduction in the performance or yields of the circuit can be provided.

Variation

Figure 9:
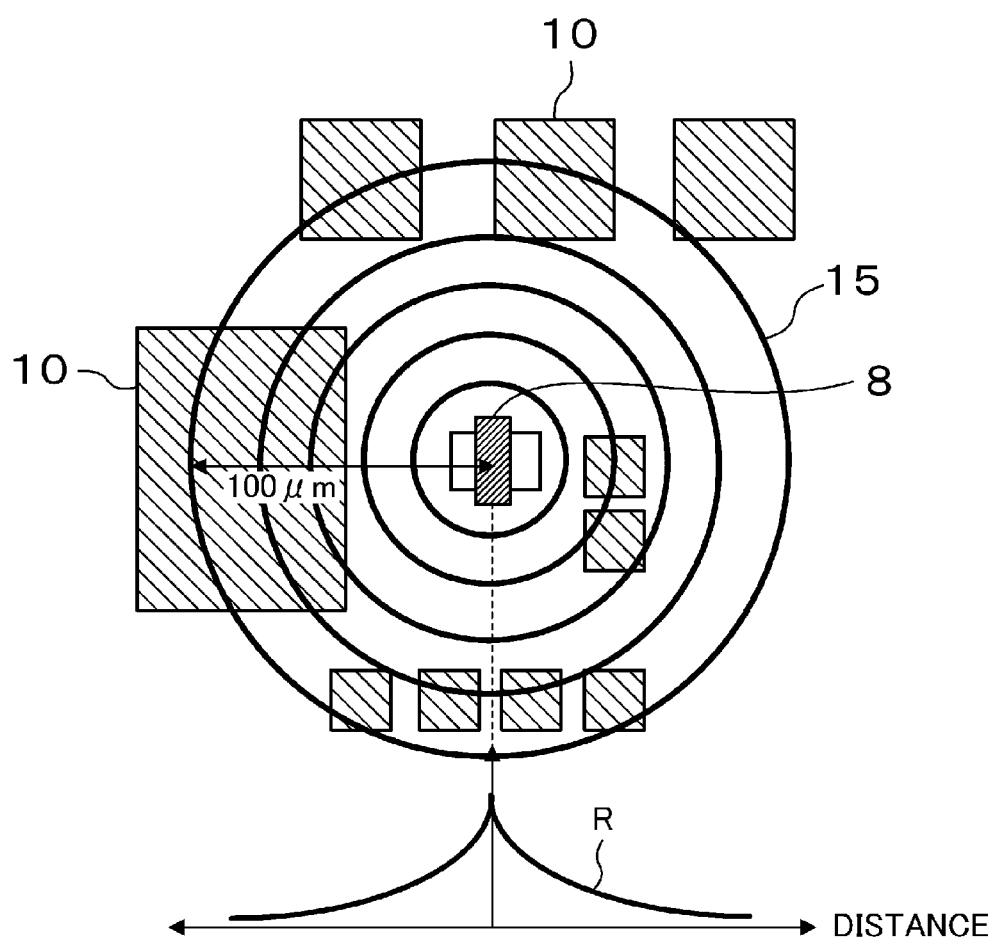
FIG. 9 is a view corresponding to FIG. 3 and illustrating a variation of the first embodiment.

FIG. 9 illustrates a variation of the circuit simulation method according to the first embodiment of the present disclosure.

While the rectangular region 9 within about 100 μm around the target transistor 8 is used in the first embodiment, a circular region 15 within about 100 μm around the target transistor 8 is used in this variation, and the area ratio information in the circular region 15 is extracted.

The circular region 15 is concentrically segmented around the position of the target transistor 8. Similar to the first embodiment, the mask layout area ratio 11 is extracted in each of the segmented regions and weighted by multiplying the mask layout area ratio 11 by the distance-dependent data 7, and then, the sum of the weighted mask layout area ratios 11 of the segmented regions is the parameter α.

As such, other than the rectangular regions, the mask layout area ratio may be extracted in each of the circular regions to obtain the parameter α.

Second Embodiment

A circuit simulation method according to a second embodiment of the present disclosure will be described with reference to FIG. 10.

The circuit simulation method according to the second embodiment is the same as the method of the first embodiment to the characteristic change calculation 14 for calculating the electrical characteristic change ΔP of the transistor caused by the influence of the mask layout pattern.

Figure 10:
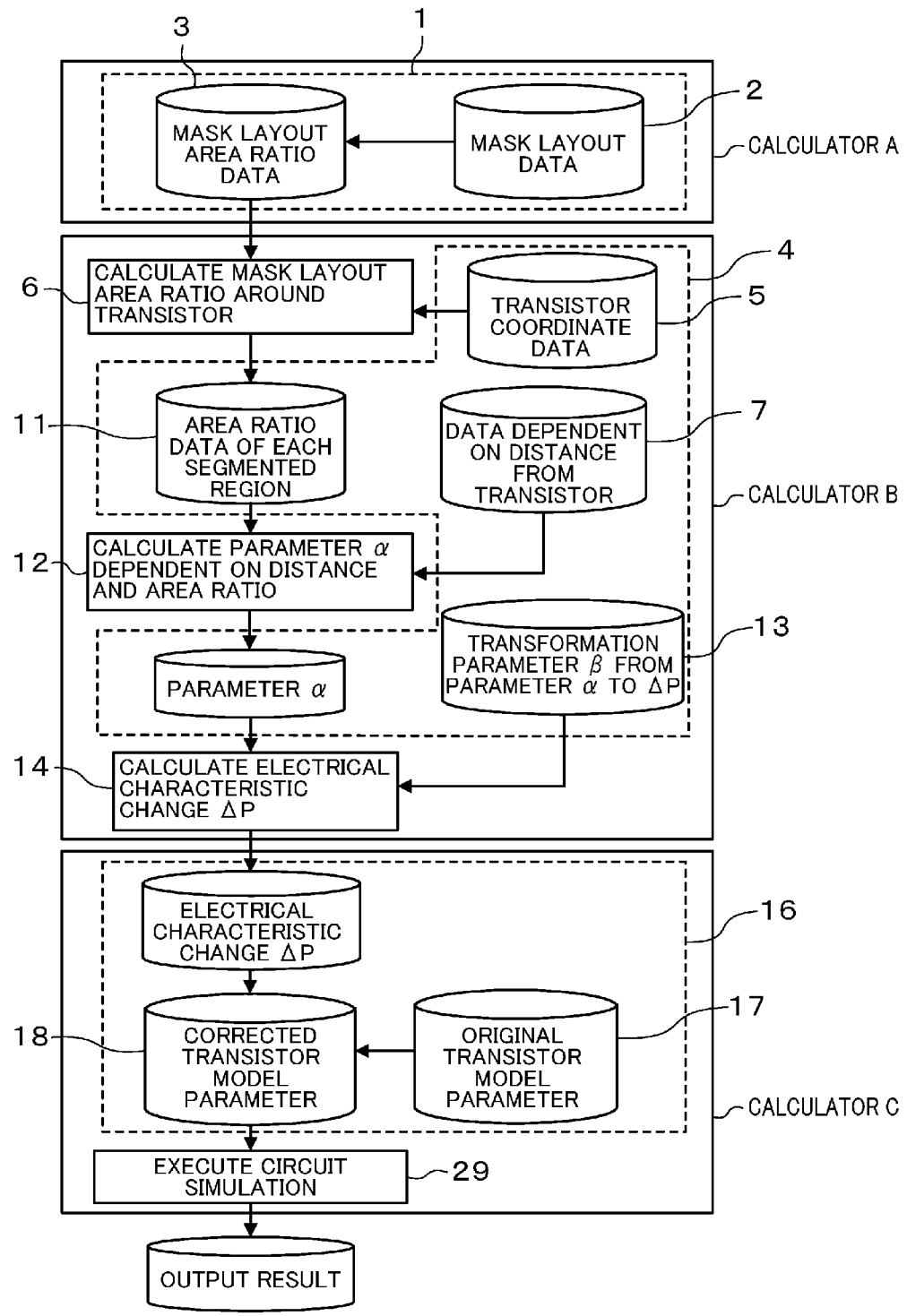
FIG. 10 is a flow chart illustrating a circuit simulation method according to a second embodiment.

In FIG. 10, the circuit simulation method according to this embodiment is performed using a calculator C and a memory 16. The calculator C stores in the memory 16, the electrical characteristic change ΔP of the transistor obtained by using the calculator B, and a transistor model parameter (original model parameter) 17 determining the electrical characteristics of the target transistor 8. The transistor model parameter 17 is extracted from the electrical characteristics of the transistor where the form of the mask layout 10 around the target transistor 8 is fixed to a predetermined pattern, and the transistor model parameter before considering the mask layout dependency.

In the circuit simulation method according to this embodiment, the calculator C reflects the electrical characteristic change ΔP of the transistor caused by the influence of the mask layout pattern in a corrected transistor model parameter 18, and executes circuit simulation 29. As a result, the electrical characteristic change according to the pattern of the desired mask layout 10 can be considered at the design stage, thereby providing highly accurate circuit designing.

For example, in circuit simulation using a MOSFET model such as a BSIM3 and a BSIM4, which are developed at U. C. Berkeley, an influence at the circuit level can be recognized by reflecting the electrical characteristic change ΔP.

The electrical parameter 17 of the transistor, which is calculated as the electrical characteristic change ΔP includes the transistor current and the threshold voltage.

Specifically, where the transistor model parameter 17 including the transistor current and the threshold voltage, which determine the electrical characteristics of the transistor, is prepared in a MOSFET model such as a BSIM3 and a BSIM4, the transistor current Id is expressed in the MOSFET model by the following equation (3) including a carrier mobility parameter U0, a source/drain parasitic resistance parameter RDSW, and a saturated velocity parameter VSAT.

$$Id = F(U0, RDSW, VSAT) \quad (3)$$

The threshold voltage Vth is expressed by the following equation (4) using the threshold voltage parameter VTH0 where the gate/drain voltage is 0, and the V gate length is great.

$$Vth = G(VTH0) \quad (4)$$

The transistor model parameter 17 such as the transistor current Id and the threshold voltage Vth as above is corrected in accordance with the pattern of the mask layout 10 around the target transistor based on the transistor current change ΔP_Id and the threshold voltage change ΔP_Vth, which are calculated as the electrical characteristic change ΔP. Specifically, where the corrected parameter are U0', RDSW', VSAT', and VTH0', the correction is expressed by the following equations (5).

$$U0' = U0 \times \Delta P\_Id$$

$$RDSW' = RDSW/\Delta P\_Id$$

$$VSAT' = VSAT \times \Delta P\_Id$$

$$VTH0' = VTH0 + \Delta P\_Vth \quad (5)$$

As such, the corrected transistor model parameter 18 is prepared. The calculator C executes circuit simulation using the corrected transistor model parameter 18 stored in the memory 16. This reflects a change in the electrical characteristics according to the pattern of the mask layout 10 around each of the transistors in the circuit, thereby providing highly accurate simulation at the circuit level.

Third Embodiment

A circuit simulation method according to a third embodiment of the present disclosure will be described with reference to FIG. 11.

In this embodiment, the roles such as calculation or data storage of the plurality of calculators are changed. Specifically, out of the three calculators A, D and E, the calculator A is the same as in the first embodiment. The calculator D executes the area ratio calculation 6 and the parameter calculation 12, and stores the transistor coordinate data 5, the area ratio data 11 in each of the segmented regions, and the distance-dependent data 7 in a memory 19 included in the calculator D. The calculator E executes the characteristic change calculation 14 and the circuit simulation 29, and holds the parameter α, the transformation parameter β (13), the original transistor model parameter 17, and the corrected transistor model parameter 18 in a memory 20 included in the calculator E.

The other calculation such as the calculation of the area ratio and the parameter α is similar to that in the first embodiment, and the explanation thereof is thus omitted.

Fourth Embodiment

A circuit simulation method according to a fourth embodiment of the present disclosure will be described with reference to FIG. 12.

In the circuit simulation method of the figure, the procedure to the parameter calculation 12 is the same as in the third embodiment.

In the circuit simulation method of the figure, a calculator F and a memory 21 are used. The calculator F receives and stores the calculated parameter α, and a transistor model parameter 22 determining the electrical characteristics of the target transistor 8 in the memory 21.

The transistor model parameter 22 stored in the memory 21 is extracted from the electrical characteristics of the transistor where the form of the mask layout 10 around the target transistor 8 is fixed to a predetermined pattern, and the transistor model parameter before considering the mask layout dependency.

In the circuit simulation method according to this embodiment, the electrical characteristic change ΔP of the transistor defined by the parameter α dependent on the distance and the area ratio of the mask layout around the transistor is calculated in a MOSFET model, and the circuit simulation is performed, thereby considering the electrical characteristic change according to the pattern of the desired mask layout 10 at the design stage of the circuit.

The electrical characteristics of the transistor defined by the parameter α includes the transistor current and the threshold voltage, and is reflected based on the parameter α in accordance with the pattern of the mask layout 10 around the target transistor.

For example, in circuit simulation using a MOSFET model such as a BSIM3 and a BSIM4, which are developed at U. C. Berkeley, the reflected transistor current $I_{ds}$' and threshold voltage Vth' are expressed by the following equations (6).

$$I_{ds}' = I_{ds} \cdot (1 + \gamma \cdot \text{parameter } \alpha)$$

$$Vth' = Vth \cdot (\delta \cdot \text{parameter } \alpha) \quad (6)$$

In these equations, $I_{ds}$' and Vth are the original transistor current and the original transistor threshold voltage, respectively, and γ and δ are fitting parameters. The parameters γ and δ are included in the transistor model parameter 22, and used in calculation of the MOSFET model when executing circuit simulation.

As such, the calculator F executes the circuit simulation 29 using the MOSFET model having the function of calculating the electrical characteristic change ΔP of the transistor defined by the parameter α. This reflects a change in the electrical characteristics according to the pattern of the mask layout 10 around each of the transistors in the circuit, thereby providing highly accurate simulation verification at the circuit level.

Fifth Embodiment

Figure 13:
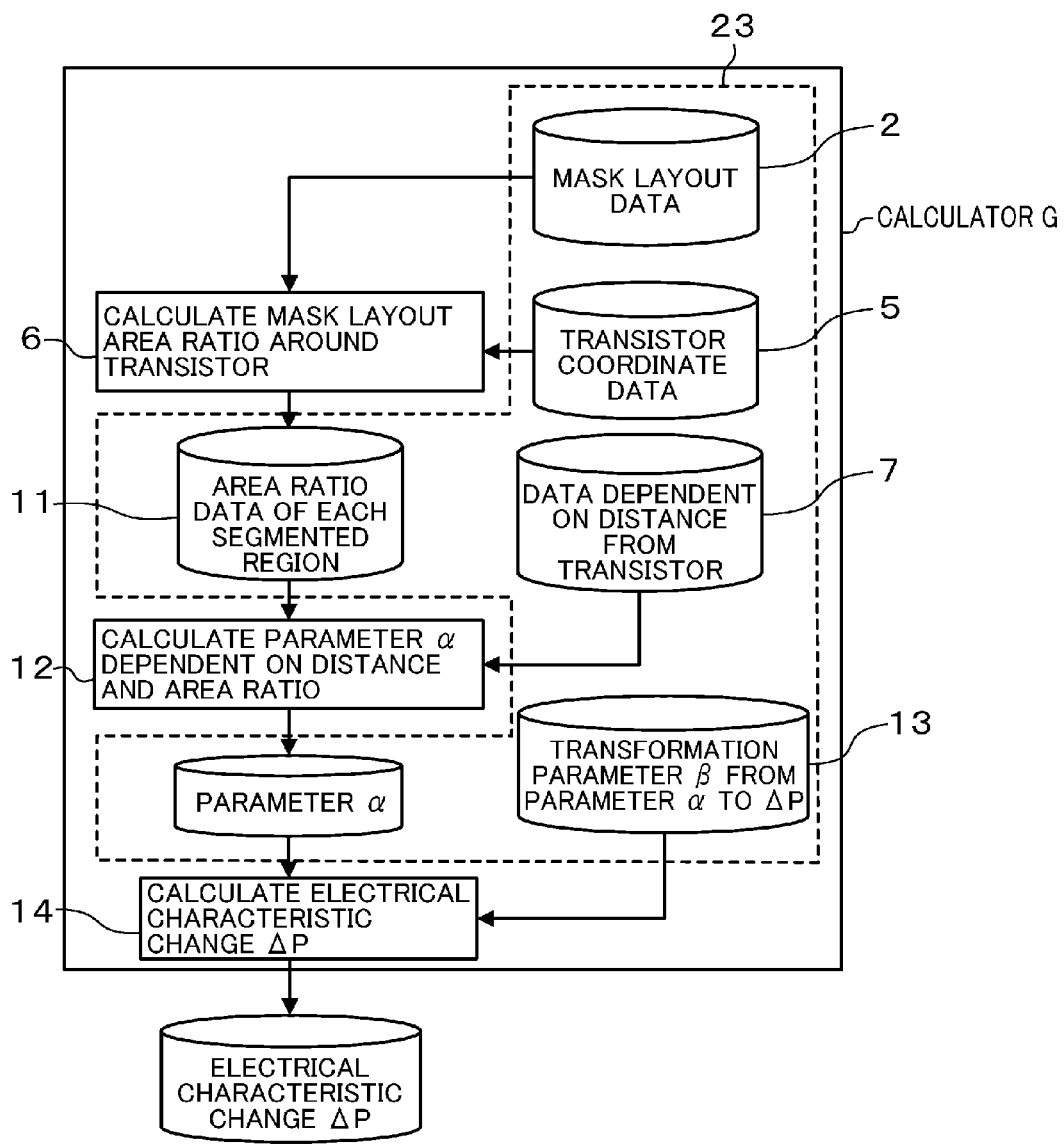
FIG. 13 is a flow chart illustrating a circuit simulation method according to a fifth embodiment.

A circuit simulation method according to a fifth embodiment of the present disclosure will be described with reference to FIG. 13.

In the circuit simulation method of the figure, the mask layout data 2 input as shown in FIG. 1 illustrating the first embodiment is directly used in the area ratio calculation 6 without calculating the target mask layout area ratio data 3 in each of the rectangular regions shown in FIG. 2. In the area ratio calculation 6, the area ratio information of the mask layout 10 in the rectangular region 9 within about 100 μm around the target transistor 8 is extracted. Then, the rectangular region 9 is segmented into a plurality of regions around the target transistor 8 so that the distances from the target transistor 8 are equal. After that, the mask layout area ratio 11 of each of the segmented regions is calculated.

A calculator G and a memory 23 included in the calculator perform all the calculation including the area ratio calculation 6, and the storage of data to the memory.

The other calculation such as the calculation of the area ratio and the parameter α is similar to that in the first embodiment, and the explanation thereof is thus omitted.

Sixth Embodiment

Figure 14:
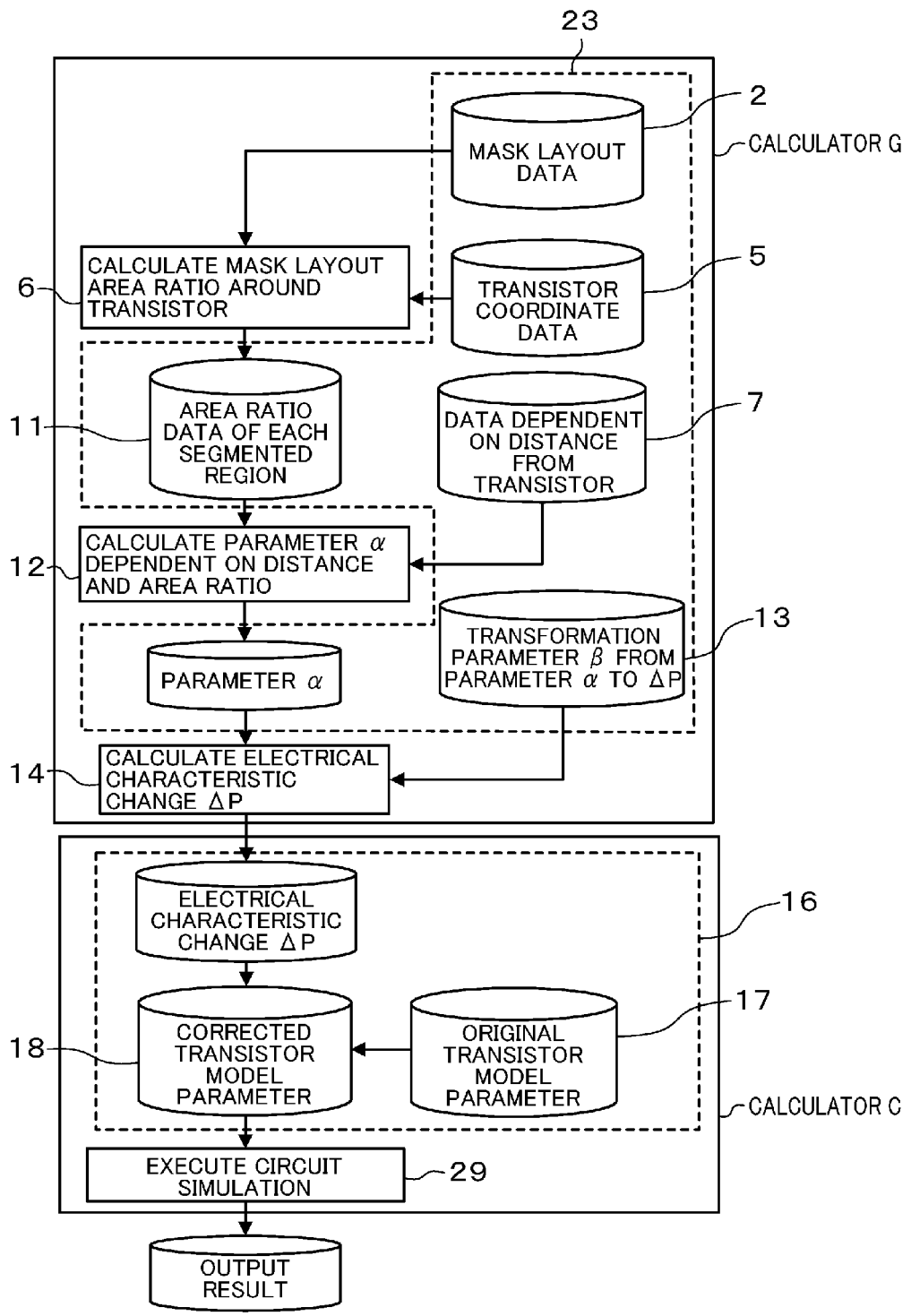
FIG. 14 is a flow chart illustrating a circuit simulation method according to a sixth embodiment.

A circuit simulation method according to a sixth embodiment of the present disclosure will be described with reference to FIG. 14.

The circuit simulation method according to this embodiment is almost similar to the method according to the second embodiment shown in FIG. 10. The difference is as follows. Similar to the fifth embodiment, in the area ratio calculation 6, the area ratio information of the mask layout 10 in the rectangular region 9 within about 100 μm around the target transistor 8 is directly extracted, and then the rectangular region 9 is segmented into a plurality of regions so that the distances from the target transistor 8 are equal to calculate the mask layout area ratio 11 of each of the segmented regions.

A calculator G and a memory 23 included in the calculator perform the area ratio calculation 6, the parameter calculation 12, and the characteristic change calculation 14; and store the mask layout data 2, the transistor coordinate data 5, the area ratio data 11 in each of the segmented regions, the distance-dependent data 7, the parameter α, and the transformation parameter β (13).

The other calculation such as the calculation of the area ratio and the parameter α is similar to that in the first embodiment, and the explanation thereof is thus omitted.

Seventh Embodiment

Figure 15:
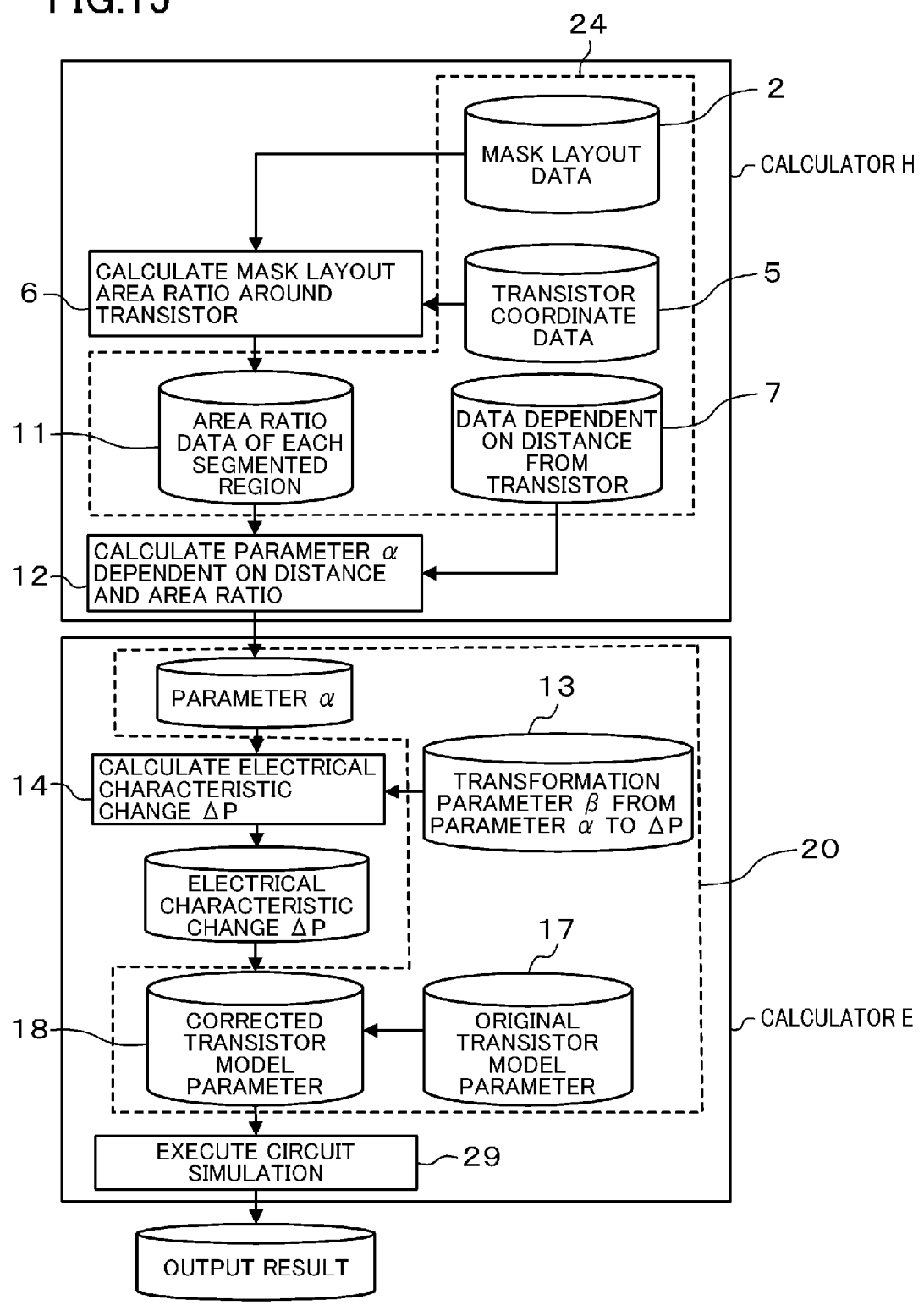
FIG. 15 is a flow chart illustrating a circuit simulation method according to a seventh embodiment.

A circuit simulation method according to a seventh embodiment of the present disclosure will be described with reference to FIG. 15.

Figure 11:
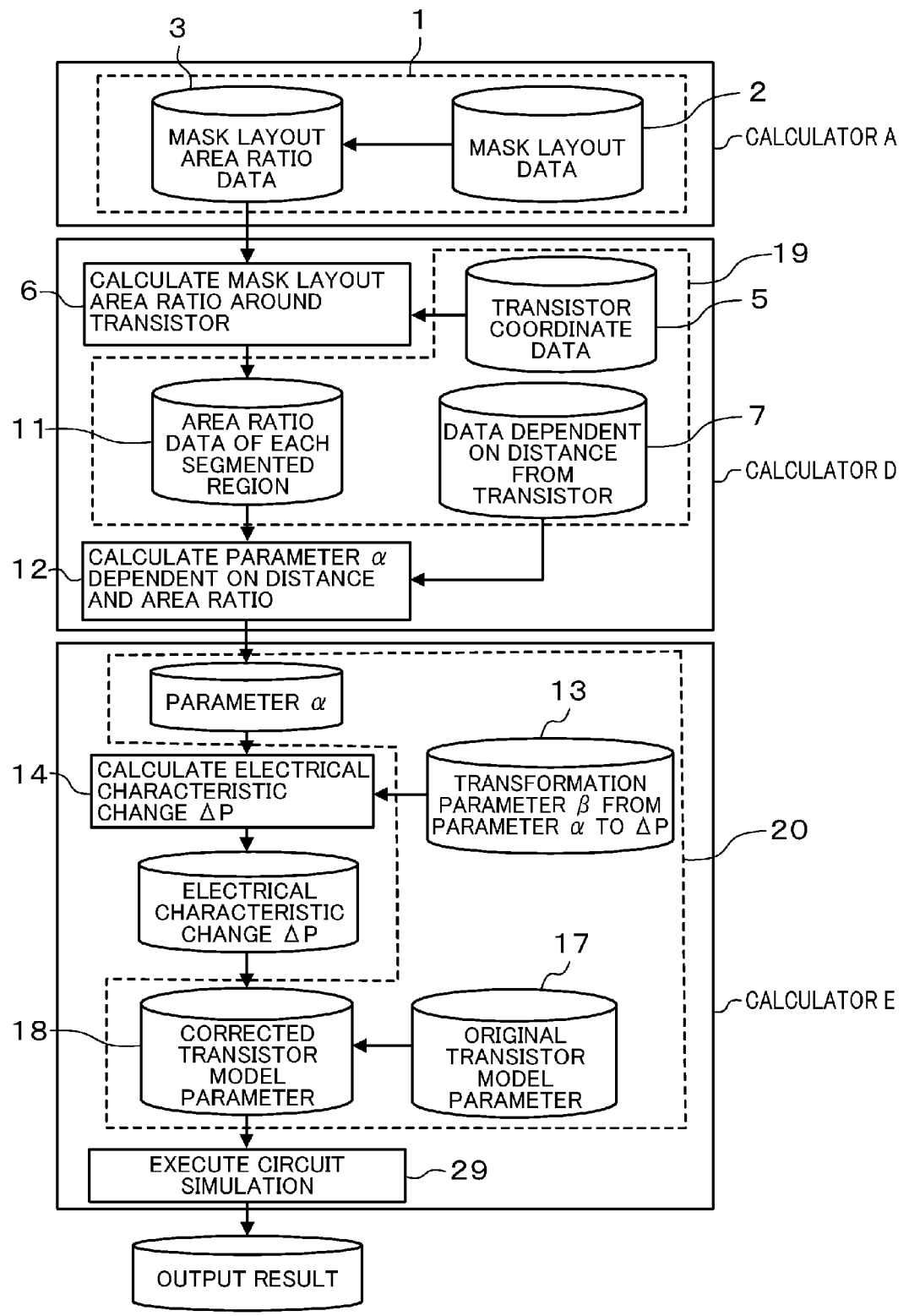
FIG. 11 is a flow chart illustrating a circuit simulation method according to a third embodiment.

The circuit simulation method according to this embodiment is almost similar to the method according to the third embodiment shown in FIG. 11. The difference is that, similar to the fifth embodiment, the mask layout area ratio 11 of each of the segmented regions is directly calculated in the area ratio calculation 6.

A calculator H and a memory 24 included in the calculator perform the area ratio calculation 6 and the parameter calculation 12; and store the mask layout data 2, the transistor coordinate data 5, the area ratio data 11 in each of the segmented regions, and the distance-dependent data 7.

The other calculation such as the calculation of the area ratio and the parameter α is similar to that in the first embodiment, and the explanation thereof is thus omitted.

Eighth Embodiment

Figure 16:
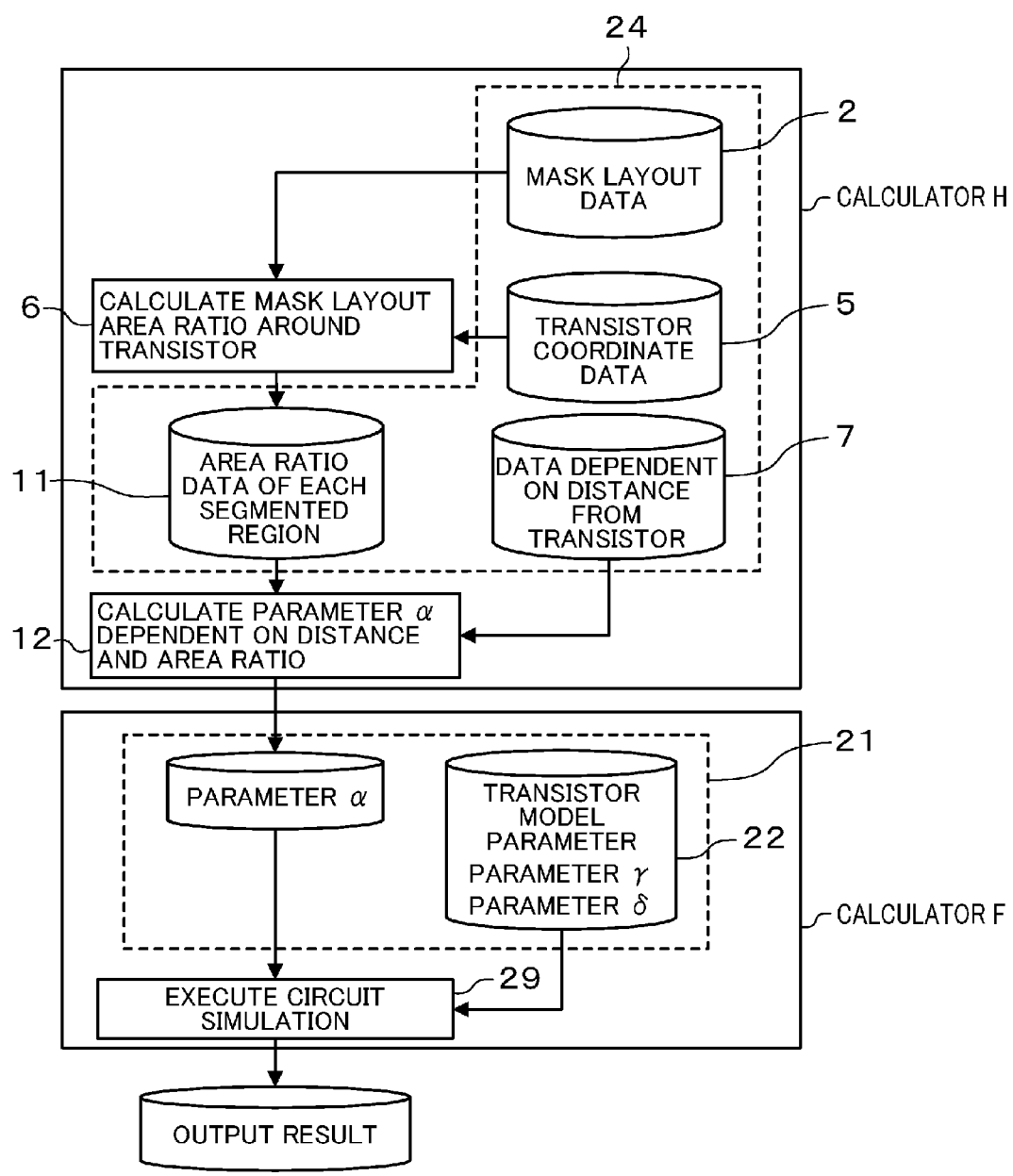
FIG. 16 is a flow chart illustrating a circuit simulation method according to an eighth embodiment.
Figure 17:
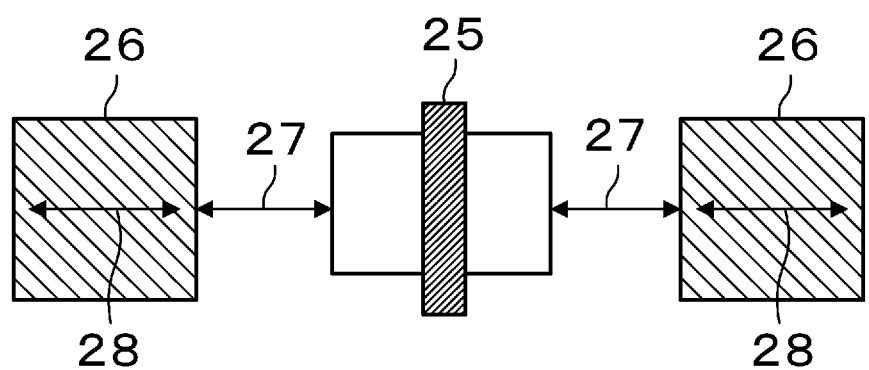
FIG. 17 illustrates a conventional circuit simulation method.

A circuit simulation method according to an eighth embodiment of the present disclosure will be described with reference to FIG. 16.

Figure 12:
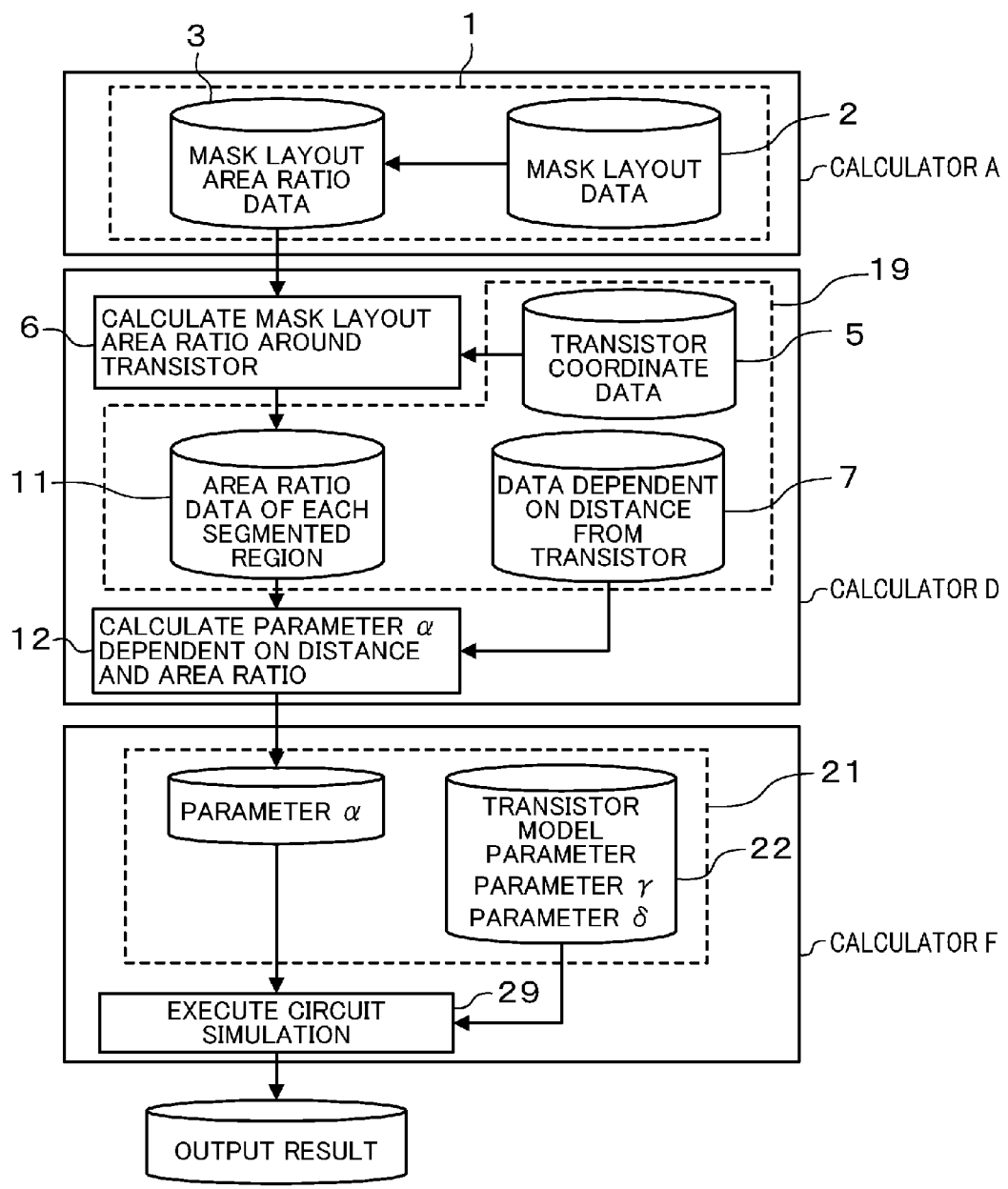
FIG. 12 is a flow chart illustrating a circuit simulation method according to a fourth embodiment.

The circuit simulation method according to this embodiment is almost similar to the method according to the fourth embodiment shown in FIG. 12. The difference is that, similar to the fifth embodiment, the mask layout area ratio 11 of each of the segmented regions is directly calculated in the area ratio calculation 6.

The calculator H and the memory 24 included in the calculator perform the area ratio calculation 6 and the parameter calculation 12; and store the mask layout data 2, the transistor coordinate data 5, and the area ratio data 11 in each of the segmented regions.

The other calculation such as the calculation of the area ratio and the parameter α is similar to that in the first embodiment, and the explanation thereof is thus omitted.

As described above, the present disclosure provides circuit simulation in view of an influence of mask layout patterns of a metal film, an active region, and a gate electrode around a transistor, and is thus useful as a circuit simulation method with an improved accuracy in designing a miniaturized semiconductor integrated circuit.

What is claimed is:

1. A method of performing circuit simulation of electrical characteristics of a transistor formed on a semiconductor substrate by using at least one calculator including a memory, the method comprising:
inputting, to the at least one calculator, mask layout data and distance-dependent data indicating degree of an influence according to a distance from the transistor;
calculating, by using the at least one calculator, an area ratio of a layout pattern of a predetermined mask from the mask layout data;
calculating, by using the at least one calculator, a parameter a based on the calculated area ratio and the distance-dependent data; and
calculating, by using the at least one calculator, a change in the electrical characteristics of the transistor based on the calculated parameter α.

2. The method of claim 1, further comprising
performing, by using the at least one calculator, circuit simulation of the electrical characteristics of the transistor in view of the change in the electrical characteristics of the transistor, which has been calculated in the calculating the change in the electrical characteristics.

3. The method of claim 1, wherein:
in the calculating the area ratio, a mask layout pattern of a metal film deposited when the transistor is formed is extracted as the layout pattern of the predetermined mask, and an area ratio of the extracted mask layout pattern of the metal film is calculated, and in the calculating the parameter, the parameter α is calculated based on the area ratio of the extracted mask layout pattern of the metal film and distance-dependent data corresponding to the mask layout pattern of the metal film.

4. The method of claim 3, wherein
the mask layout pattern of the metal film is a mask layout pattern of a TiN film.

5. The method of claim 1, wherein:
in the calculating the area ratio, a mask layout pattern of an active region is extracted as the layout pattern of the predetermined mask, and an area ratio of the extracted mask layout pattern of the active region is calculated, and in the calculating the parameter, the parameter α is calculated based on the area ratio of the extracted mask layout pattern of the active region and distance-dependent data corresponding to the mask layout pattern of the active region.

6. The method of claim 1, wherein:
in the calculating the area ratio, a mask layout pattern of a gate electrode is extracted as the layout pattern of the predetermined mask, and an area ratio of the extracted mask layout pattern of the gate electrode is calculated, and in the calculating the parameter, the parameter α is calculated based on the area ratio of the extracted mask layout pattern of the gate electrode and distance-dependent data corresponding to the mask layout pattern of the gate electrode.

7. The method of claim 1, wherein
in the calculating the area ratio, the area ratio of the layout pattern of the predetermined mask is calculated in each of regions of a predetermined area.

8. The method of claim 7, wherein
in the calculating the parameter, the area ratio of each of the regions, which has been calculated in the calculating the area ratio, is multiplied by distance-dependent data corresponding to a distance between the transistor and the region on a region-by-region basis, and the parameter α is obtained by summing multiplication results of the regions.

9. The method of claim 1, further comprising
inputting positional information of the transistor to the at least one calculator, wherein
in the calculating the area ratio, the area ratio of the layout pattern of the predetermined mask is calculated within a predetermined distance from the transistor.

10. The method of claim 9, wherein
the predetermined distance is determined based on a maximum range in which the predetermined mask layout pattern influences the transistor, and is about ten or more times as long as a distance between the transistor and a mask layout pattern located at a minimum distance in a manufacturing process.

11. The method of claim 1, wherein
the electrical characteristics of the transistor are a current flowing to the transistor or a threshold voltage of the transistor.

12. The method of claim 1, wherein:
the at least one calculator includes multiple ones of calculators, and
the calculators execute different simulating steps.

13. A semiconductor integrated circuit designed by the method of claim 1.

14. A method of performing circuit simulation of electrical characteristics of a transistor formed on a semiconductor substrate by using at least one calculator including a memory, the method comprising:

inputting, to the at least one calculator, mask layout data and distance-dependent data indicating degree of an influence according to a distance from the transistor;

calculating, by using the at least one calculator, an area ratio of a layout pattern of a predetermined mask from the mask layout data;

calculating, by using the at least one calculator, a parameter α based on the calculated area ratio and the distance-dependent data; and performing, by using the at least one calculator, circuit simulation of the electrical characteristics of the transistor based on the calculated parameter α.

15. The method of claim 14, wherein
in the calculating the area ratio, the area ratio of the layout pattern of the predetermined mask is calculated in each of regions of a predetermined area.

16. The method of claim 14, further comprising
inputting positional information of the transistor to the at least one calculator, wherein
in the calculating the area ratio, the area ratio of the layout pattern of the predetermined mask is calculated within a predetermined distance from the transistor.

17. The method of claim 16, wherein
the predetermined distance is determined based on a maximum range in which the predetermined mask layout pattern influences the transistor, and is about ten or more times as long as a distance between the transistor and a mask layout pattern located at a minimum distance in a manufacturing process.

18. The method of claim 14, wherein
the electrical characteristics of the transistor are a current flowing to the transistor or a threshold voltage of the transistor.

19. The method of claim 14, wherein:
the at least one calculator includes multiple ones of calculators, and
the calculators execute different simulating steps.

20. A semiconductor integrated circuit designed by the method of claim 14.

* * * * *